US009836105B2

(12) United States Patent
Ma

(10) Patent No.: US 9,836,105 B2
(45) Date of Patent: Dec. 5, 2017

(54) POWER OFF CONTROL CIRCUIT AND ELECTRONIC DEVICE USING SAME

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Jin-Shan Ma, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 250 days.

(21) Appl. No.: 14/830,240

(22) Filed: Aug. 19, 2015

(65) Prior Publication Data

US 2017/0054435 A1 Feb. 23, 2017

(51) Int. Cl.
*G06F 1/26* (2006.01)
*H03K 19/0175* (2006.01)
*H03K 3/356* (2006.01)

(52) U.S. Cl.
CPC ............... *G06F 1/26* (2013.01); *H03K 3/356* (2013.01); *H03K 19/0175* (2013.01)

(58) Field of Classification Search
CPC ....... G06F 1/26; H03K 3/356; H03K 19/0175
USPC .......... 327/142, 143, 198; 307/113, 114, 115
See application file for complete search history.

(56) References Cited

U.S. PATENT DOCUMENTS 7,764,085 B2 * 7/2010 Takahashi ............. H03K 5/086 326/82

* cited by examiner

*Primary Examiner* — John Poos
(74) *Attorney, Agent, or Firm* — Steven Reiss

(57) ABSTRACT

A power-off control circuit applied in an electronic device includes a switch, a first control unit, a first buffer unit, a second control unit, and a second buffer unit. A first control unit coupled to the second terminal of the switch. The first control unit receives a first logic signal when the switch is pressed, and outputs a first control signal. A first buffer unit is coupled to an output of the first control unit to receive the first control signal, and outputs a second control signal. A second buffer unit is coupled to the second terminal of the switch to receive the first logic signal, and outputs a third control signal. A second control unit is coupled to an output of the second buffer unit to receive the third control signal, and outputs a power-off control signal to make the electronic device to power-off.

12 Claims, 3 Drawing Sheets

POWER OFF CONTROL CIRCUIT AND ELECTRONIC DEVICE USING SAME

FIELD

The subject matter herein generally relates to an electronic device and in particular to a power-off control circuit therefor.

BACKGROUND

A power switch is positioned on a motherboard of an electronic device, and is configured to control the electronic device to power on or power-off. However, when the power switch is pressed by a mistake during test or manufacture, the program operating on the motherboard will be fault, or the test will be executed again.

BRIEF DESCRIPTION OF THE DRAWINGS

Implementations of the present technology will now be described, by way of example only, with reference to the attached figures.

DETAILED DESCRIPTION

Figure 1:
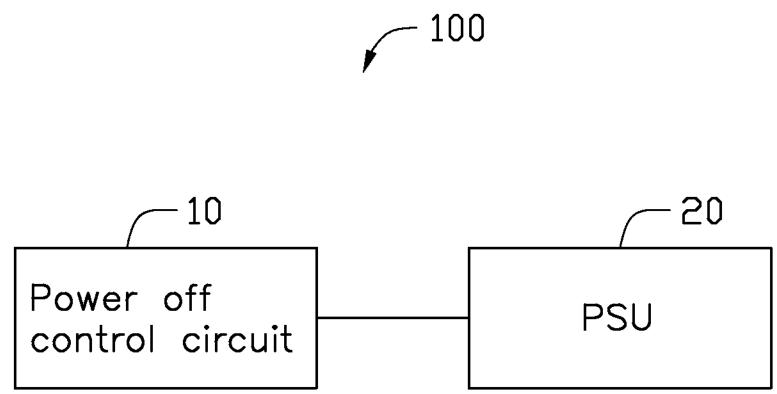
FIG. 1 is a block diagram of an embodiment of an electronic device including a power-off control circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently coupled or releasably coupled. The term "comprising," when utilized, means "including, but not necessarily limited to"; it specifically indicates open-ended inclusion or membership in the so-described combination, group, series and the like.

The disclosure will now be described in relation to an electronic device with a power-off control circuit.

FIG. 1 illustrates a block diagram of an electronic device 100 including a power-off control circuit 10 and a power source unit (PSU) 20 coupled to the power-off control circuit 10. The electronic device 20 can be a server or a computer.

Figure 2:
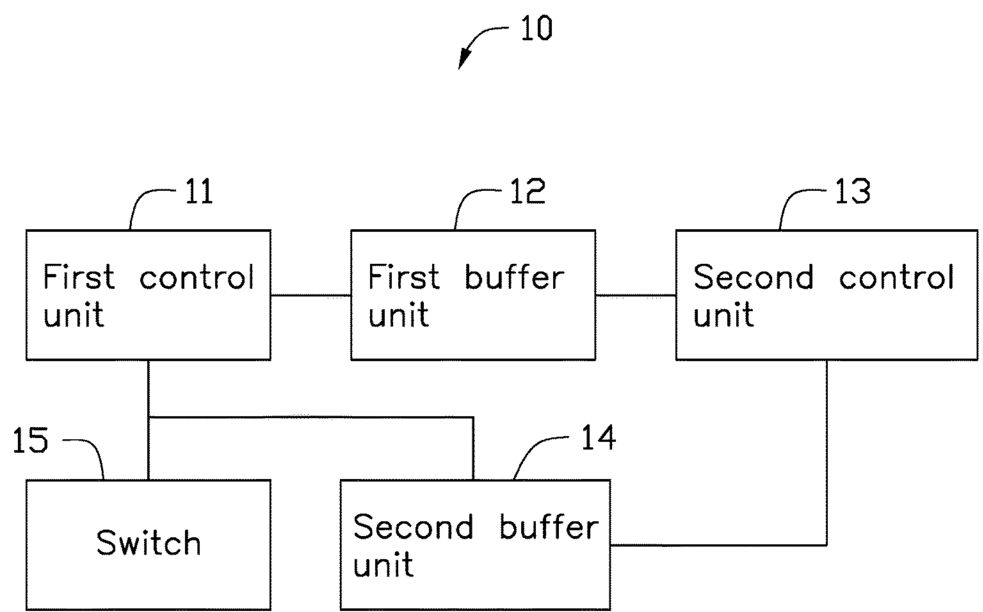
FIG. 2 is a block diagram of an embodiment of the power-off control circuit of FIG. 1.

FIG. 2 is a block diagram of the power-off control circuit 10 including a first control unit 11, a first buffer unit 12, a second control unit 13, a second buffer unit 14, and a switch 15.

Figure 3:
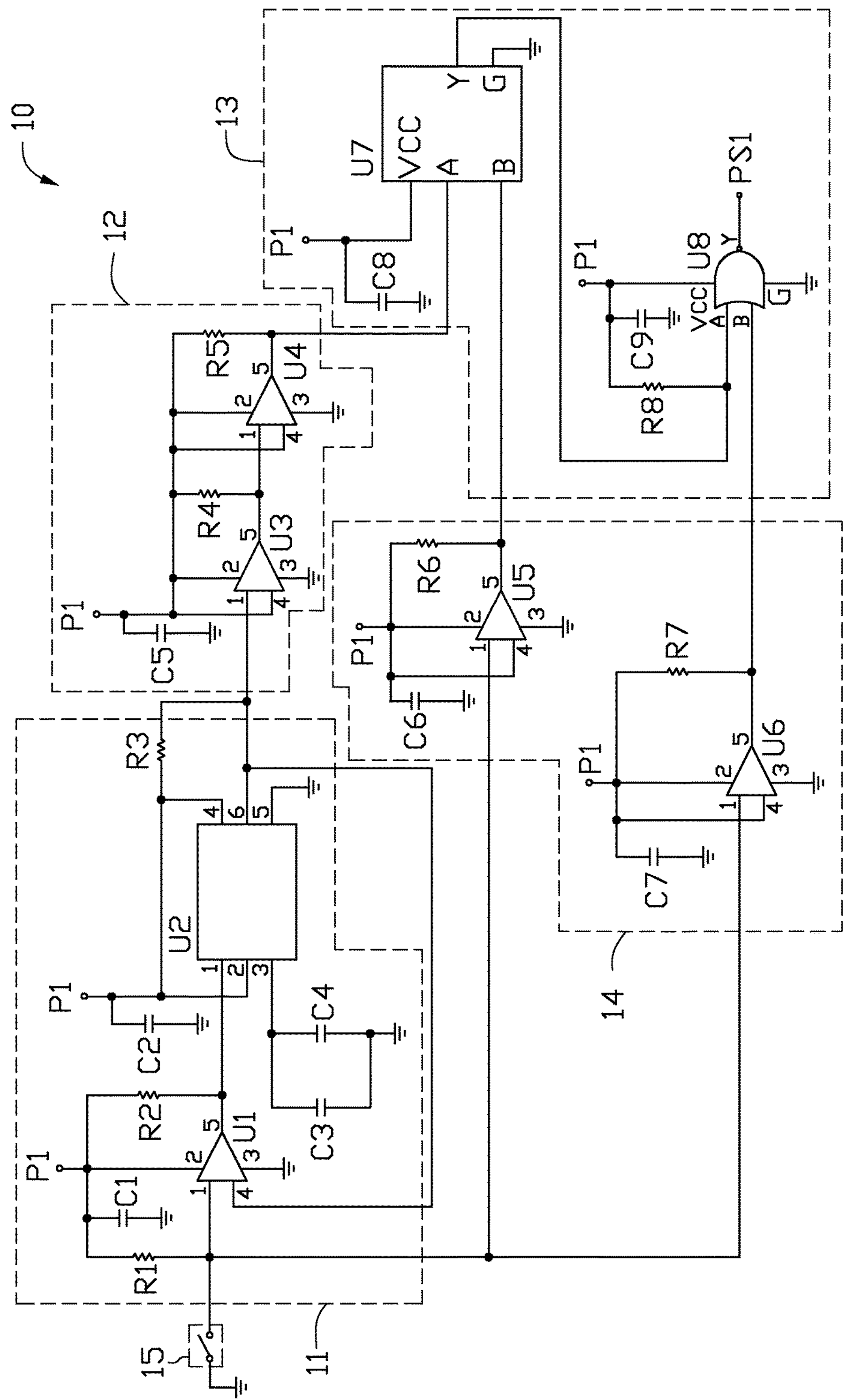
FIG. 3 is a circuit diagram of an embodiment of the power-off control circuit FIG. 1.

FIG. 3 is a circuit diagram of the power-off control circuit 10. A first terminal of the switch 15 is coupled to ground. A second terminal of the switch 15 is coupled to the first control unit 11. The first control unit 11 includes a first buffer chip U1, A delay chip U2, resistors R1, R2, R3, and capacitors C1, C2, C3, C4. An input pin 1 of the first buffer chip U1 is coupled to the second terminal of the switch 15, and is coupled to a power supply P1 through the resistor R1. A voltage pin 2 of the first buffer chip U1 is coupled to the power supply P1, and is grounded through the capacitor C1. A ground pin 3 is grounded. An enable pin 4 is coupled to an output of the first control unit 11. An output pin 5 of the first buffer chip U1 is coupled to the power supply through the resistor R2, and is coupled to a manual pin 1 of the delay chip U2. The manual pin 1 of the delay chip U2 is coupled to the power supply P1, and is grounded through the capacitor C2. A sense pin 2 of the delay chip U2 is coupled to the power supply P1, and is grounded through the capacitor C2. A time pin 3 of the delay chip U2 is grounded through the capacitors C3 and C4. A voltage pin 4 of the delay chip U2 is coupled to the power supply P1. A reset pin 2 of the delay chip U2 functions as the output of the first control unit 11, and is coupled to the enable pin 4 of the first buffer chip U1. The reset pin 6 of the delay chip U2 is coupled to the voltage pin 4 of the delay chip U2 through the resistor R3. A ground pin 5 of the delay chip U2 is coupled to ground.

The first buffer unit 12 includes a second buffer chip U3, a third buffer chip U4, resistors R4, R5, and a capacitor C5. An input pin 1 of the second buffer chip U3 is coupled to the power supply P1, and is grounded through the capacitor C5. The input pin 1 of the second buffer chip U3 is coupled to the reset pin 2 of the delay chip U2, and is coupled to the power supply P1. An enable pin 4 of the second buffer chip U3 is coupled to the power supply P1. The power supply P1 is grounded through the capacitor C5. A voltage pin 2 of the second buffer chip U3 is coupled to the power supply P1. A ground pin 3 of the second buffer chip U3 is coupled to ground. An output pin 5 of the second buffer chip U3 is coupled to the power supply P1 through the fourth resistor R4. An input pin 1 of the through buffer chip U4 is coupled to the output pin 5 of the second buffer chip U3, and is coupled to the power supply P1. An input pin 2 of the third buffer chip U4 is coupled to the power supply P1. A ground pin 3 of the third buffer chip U4 is coupled to ground. A fourth pin 4 of the third buffer chip U4 is coupled to the power supply P1. An output pin 5 is coupled to the power supply P1 through the resistor R5, and functions as an output of the first buffer unit 12 coupling to the second control unit 13.

The second buffer unit 14 includes a fourth buffer chip U5, a fifth buffer chip U6, resistors R6, R7, and capacitors C6, C7. Input pins of the fourth and fifth buffer chips U5 and U6 are coupled to the input pin 1 of the first buffer chip U1, and are coupled to the power supply P1. The power supply P1 is grounded through capacitors C6, C7. Voltage pins 2 of the fourth and fifth buffer chips U5 and U6 are coupled to the power supply P1. Ground pins 3 of the fourth and fifth buffer chips U5 and U6 are grounded. Enable pins 4 of the fourth and fifth buffer chips U5 and U6 are coupled to the power supply P1. Output pins 5 of the fourth and fifth buffer chips U5 and U6 are coupled to the power supply P1 through resistors R6, R7 respectively, and are coupled to the second control unit 13.

The second control unit 13 includes a first electronic switch U7 and a second electronic switch U8. In the illustrated embodiment, the first electronic switch U7 is an exclusive-OR gate. The second electronic switch U8 is a NOR gate. A voltage pin VCC of the first electronic switch U7 is coupled to the power supply P1, and is grounded through a capacitor C8. A first input pin A of the first electronic switch U7 is coupled to the output pin 5 of the third buffer chip U4. A second pin B of the first electronic switch U7 is coupled to the output pin 5 of the fifth buffer chip U6. A ground pin G of the first electronic switch U7 is grounded. An output pin Y of the sixth buffer chip U7 is coupled to a first input pin A of the second electronic switch U8. The first input pin A of the second electronic switch U8 is coupled to the power supply P1 through a resistor R8, and is grounded through a capacitor C9. A second input pin B of the second electronic switch U8 is coupled to the output pin 5 of the fifth buffer chip U6. A ground pin G of the second electronic switch U8 is grounded. An output pin Y of the second electronic switch U8 functions as an output of the power-off control circuit 10, and outputs a power-off control signal PS1 to the PSU 20 of the electronic device 100.

In the illustrated embodiment, each type of the buffer chip U1, U3, U4, U5, U6 is 74HC1G126. A type of the delay chip U2 is TPS3808. The power supply P1 is a power terminal AUX_3V3.

In operation, when the switch is pressed, the input pin 1 of the first buffer chip U1 receives a digital low level signal, such as logic "0". The enable pin 4 of the first buffer chip U1 receives a digital high level signal, such as logic "1", from the power supply P1 through resistor R3. The output pin 5 of the first buffer chip U1 outputs a digital low level signal to the manual pin MR of the delay chip U2. The reset pin RESET of the delay chip U2 outputs a digital low level signal for a preset time, such as 5 seconds. The enable pin 4 of the first buffer chip U1 receives a digital low level signal from the reset pin RESET of the delay chip U2, to make the first buffer chip stops operating. The input pin 1 of the second buffer chip U3 receives the digital low level signal from the reset pin RESET of the delay chip U2 after 5 seconds. The enable pin 4 of the second buffer chip U3 receives a digital high level signal from the power supply P1. The second buffer chip U3 is turned on, and outputs a digital low signal to the input pin 1 of the third buffer chip U4. The enable pin 4 of the third buffer chip U4 receives a digital high level signal from the power supply P1. The third buffer chip U4 is turned on, and outputs a digital low signal to the first input pin A of the first electronic switch U7.

If the switch 15 is still pressed after 5 seconds, the enable pin 4 of the fourth buffer chip U5 receives a digital high level signal from the power supply P1. The fourth buffer chip U5 outputs a digital low signal to the second input pin B of the first electronic switch U7. The first electronic switch U7 outputs a digital low signal to the first input pin A of the second electronic switch U8. The second input B of the second electronic switch U8 can receive a digital low signal from the switch 15 through the fifth buffer chip U6. Therefore, the output pin Y of the second electronic switch U8 outputs a digital high signal PS1 to the PSU 20, to power-off the electronic device 100, which can avoid the powering off immediately in mistake.

While the disclosure has been described by way of example and in terms of the embodiment, it is to be understood that the disclosure is not limited thereto. On the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A power-off control circuit comprising:

a switch comprising a first terminal and a second terminal, the first terminal coupled to ground;

a first control unit coupled to the second terminal of the switch, the first control unit configured to receive a first logic signal and output a first control signal in event the switch is pressed;

a first buffer unit coupled to an output of the first control unit, the first buffer unit configured to receive the first control signal and output a second control signal;

a second buffer unit coupled to the second terminal of the switch, the second buffer unit configured to receive the first logic signal and output a third control signal; and a second control unit coupled to an output of the second buffer unit, the second control unit configured to receive the third control signal and output a power-off control signal;

wherein the first control unit comprises a first buffer chip and a delay chip; an input pin of the first buffer chip is coupled to the second terminal of the switch; a voltage pin of the first buffer chip is coupled to a power supply; a ground pin of the first buffer chip is coupled to ground; an enable pin of the first buffer chip is coupled to a reset pin of the delay chip; an output pin of the first buffer chip is coupled to a manual pin of the delay chip; a sense pin of the delay chip is coupled to the power supply; a time pin of the delay chip is coupled to ground; a voltage pin of the delay chip is coupled to the power supply; a ground pin of the delay chip is coupled to ground; and a reset pin of the delay chip functions as the output of the first control unit.

2. The power-off control circuit of claim 1, wherein the first control unit further comprises first to third resistors and first to fourth capacitors; the input pin of the first buffer chip is coupled to the power supply through the first resistor; the voltage pin of the first buffer chip is grounded through the first capacitor; the output pin of the first buffer chip is coupled to the power supply through the second resistor; the sense pin of the delay chip is grounded through the second capacitor; the time pin of the delay chip is grounded through the third and fourth capacitors; the reset pin of the delay chip is coupled to the voltage pin of the delay chip through the third resistor.

3. The power-off control circuit of claim 2, wherein the first buffer unit comprises a second buffer chi, a third buffer chip, fourth and fifth resistors, and a fifth capacitor; an input pin of the second buffer chip is coupled to the power supply, and is grounded through the fifth capacitor; the input pin of the second buffer chip is coupled to the reset pin of the delay chip, and is coupled to the power supply; an enable pin of the second buffer chip is coupled to the power supply; the power supply is grounded through the fifth capacitor; a voltage pin of the second buffer chip is coupled to the power supply; a ground pin of the second buffer chip is coupled to ground; an output pin of the second buffer chip is coupled to the power supply through the fourth resistor; an input pin of the through buffer chip is coupled to the output pin of the second buffer chip, and is coupled to the power supply; an input pin of the third buffer chip is coupled to the power supply; a ground pin of the third buffer chip is coupled to ground; a fourth pin of the third buffer chip is coupled to the power supply; an output pin is coupled to the power supply through the fifth resistor, and functions as an output of the first buffer unit coupling to the second control unit.

4. The power-off control circuit of claim 3, wherein the second buffer unit comprises a fourth buffer chip, a fifth buffer chip, sixth and seventh resistors, and sixth and seventh capacitors; input pins of the fourth and fifth buffer chips are coupled to the input pin of the first buffer chip, and are coupled to the power supply; the power supply is grounded through sixth and seventh capacitors; voltage pins of the fourth and fifth buffer chips are coupled to the power supply; ground pins of the fourth and fifth buffer chips are grounded; enable pins of the fourth and fifth buffer chips are coupled to the power supply; output pins of the fourth and fifth buffer chips are coupled to the power supply through the sixth and seventh resistors respectively, and are coupled to the second control unit.

5. The power-off control circuit of claim 4, wherein the second control unit comprises a first electronic switch, a second electronic switch; a voltage pin of the first electronic switch is coupled to the power supply, and is grounded through a capacitor; a first input pin of the first electronic switch is coupled to the output pin of the third buffer chip; a second pin of the first electronic switch is coupled to the output pin of the fifth buffer chip; a ground pin of the first electronic switch is grounded; an output pin of the sixth buffer chip is coupled to a first input pin of the second electronic switch; the first input pin of the second electronic switch is coupled to the power supply through a resistor, and is grounded through a capacitor; a second input pin of the second electronic switch is coupled to the output pin of the fifth buffer chip; a ground pin of the second electronic switch is grounded; an output pin of the second electronic switch functions as an output of the power-off control circuit; and outputs a power-off control signal to control the electronic device to power-off.

6. The power-off control circuit of claim 5, wherein the first electronic switch is an exclusive-OR gate, and the second electronic switch is a NOR gate.

7. An electronic device comprising a power-off control circuit, the power-off control circuit comprising:

a switch comprising a first terminal and a second terminal, the first terminal coupled to ground;

a first control unit coupled to the second terminal of the switch, the first control unit configured to receive a first logic signal and output a first control signal in event the switch is pressed;

a first buffer unit coupled to an output of the first control unit, the first buffer unit configured to receive the first control signal and output a second control signal;

a second buffer unit coupled to the second terminal of the switch, the second buffer unit configured to receive the first logic signal and output a third control signal; and a second control unit coupled to an output of the second buffer unit, the second control unit configured to receive the third control signal and output a power-off control signal;

wherein the first control unit comprises a first buffer chip and a delay chip; an input pin of the first buffer chip is coupled to the second terminal of the switch; a voltage pin of the first buffer chip is coupled to a power supply; a ground pin of the first buffer chip is coupled to ground; an enable pin of the first buffer chip is coupled to a reset pin of the delay chip; an output pin of the first buffer chip is coupled to a manual pin of the delay chip; a sense pin of the delay chip is coupled to the power supply; a time pin of the delay chip is coupled to ground; a voltage pin of the delay chip is coupled to the power supply; a ground pin of the delay chip is coupled to ground; and a reset pin of the delay chip functions as the output of the first control unit.

8. The electronic device of claim 7, wherein the first control unit further comprises first to third resistors and first to fourth capacitors; the input pin of the first buffer chip is coupled to the power supply through the first resistor; the voltage pin of the first buffer chip is grounded through the first capacitor; the output pin of the first buffer chip is coupled to the power supply through the second resistor; the sense pin of the delay chip is grounded through the second capacitor; the time pin of the delay chip is grounded through the third and fourth capacitors; the reset pin of the delay chip is coupled to the voltage pin of the delay chip through the third resistor.

9. The electronic device of claim 8, wherein the first buffer unit comprises a second buffer chi, a third buffer chip, fourth and fifth resistors, and a fifth capacitor; an input pin of the second buffer chip is coupled to the power supply, and is grounded through the fifth capacitor; the input pin of the second buffer chip is coupled to the reset pin of the delay chip, and is coupled to the power supply; an enable pin of the second buffer chip is coupled to the power supply; the power supply is grounded through the fifth capacitor; a voltage pin of the second buffer chip is coupled to the power supply; a ground pin of the second buffer chip is coupled to ground; an output pin of the second buffer chip is coupled to the power supply through the fourth resistor; an input pin of the through buffer chip is coupled to the output pin of the second buffer chip, and is coupled to the power supply; an input pin of the third buffer chip is coupled to the power supply; a ground pin of the third buffer chip is coupled to ground; a fourth pin of the third buffer chip is coupled to the power supply; an output pin is coupled to the power supply through the fifth resistor, and functions as an output of the first buffer unit coupling to the second control unit.

10. The electronic device of claim 9, wherein the second buffer unit comprises a fourth buffer chip, a fifth buffer chip, sixth and seventh resistors, and sixth and seventh capacitors; input pins of the fourth and fifth buffer chips are coupled to the input pin of the first buffer chip, and are coupled to the power supply; the power supply is grounded through sixth and seventh capacitors; voltage pins of the fourth and fifth buffer chips are coupled to the power supply; ground pins of the fourth and fifth buffer chips are grounded; enable pins of the fourth and fifth buffer chips are coupled to the power supply; output pins of the fourth and fifth buffer chips are coupled to the power supply through the sixth and seventh resistors respectively, and are coupled to the second control unit.

11. The electronic device of claim 10, wherein the second control unit comprises a first electronic switch, a second electronic switch; a voltage pin of the first electronic switch is coupled to the power supply, and is grounded through a capacitor; a first input pin of the first electronic switch is coupled to the output pin of the third buffer chip; a second pin of the first electronic switch is coupled to the output pin of the fifth buffer chip; a ground pin of the first electronic switch is grounded; an output pin of the sixth buffer chip is coupled to a first input pin of the second electronic switch; the first input pin of the second electronic switch is coupled to the power supply through a resistor, and is grounded through a capacitor; a second input pin of the second electronic switch is coupled to the output pin of the fifth buffer chip; a ground pin of the second electronic switch is grounded; an output pin of the second electronic switch functions as an output of the power-off control circuit; and outputs a power-off control signal to control the electronic device to power-off.

12. The electronic device of claim 11, wherein the first electronic switch is an exclusive-OR gate, and the second electronic switch is a NOR gate.

* * * * *